Figure 1:
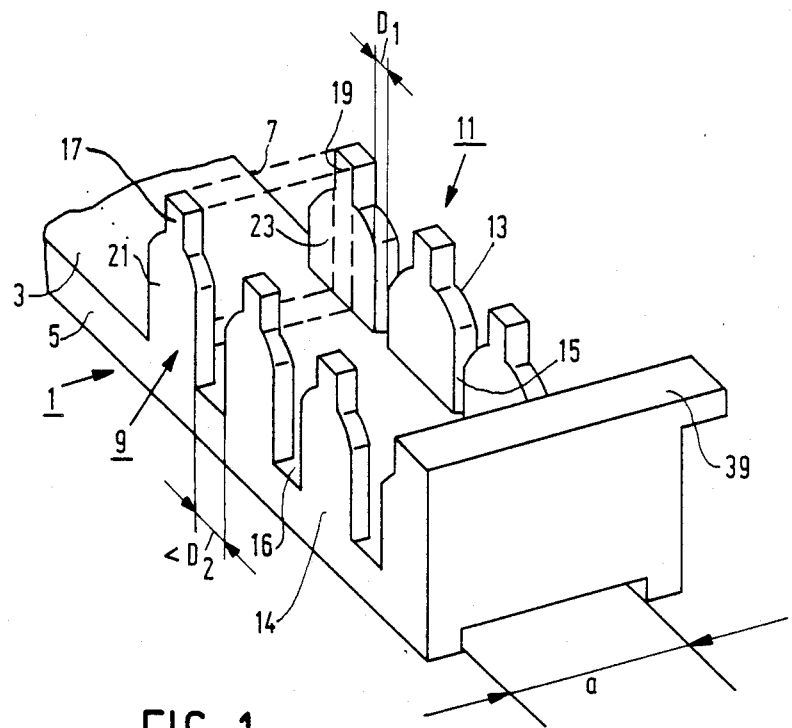

United States Patent [19]

Thenner

[11] Patent Number: 4,654,967
[45] Date of Patent: Apr. 7, 1987

[54] METHOD AND DEVICE FOR ALIGNING AND STRAIGHTENING FLEXIBLE, INSULATED CONDUCTORS

[75] Inventor: Günther Thenner, Giessen, Fed. Rep. of Germany

[73] Assignee: U.S. Philips Corporation, New York, N.Y.

[21] Appl. No.: 770,029

[22] Filed: Aug. 27, 1985

[30] Foreign Application Priority Data

Sep. 6, 1984 [DE] Fed. Rep. of Germany ....... 3432735

[51] Int. Cl.⁴ .................... H01R 43/02; B23P 21/00
[52] U.S. Cl. ........................... 29/860; 29/721; 29/755; 174/72 A; 269/903; 339/17 LC
[58] Field of Search ................ 29/860, 721, 857, 755, 29/861, 872, 759; 140/71 R; 339/17 LC, 17 L; 174/72 A; 269/147, 903, 43; 228/180.1, 212; 248/68.1

[56] References Cited

U.S. PATENT DOCUMENTS

| | | |
|---|---|---|
| 3,007,498 | 11/1961 | Clore ........................ 174/72 A X |
| 3,459,878 | 8/1969 | Gressitt et al. .................. 29/872 X |
| 3,485,937 | 12/1969 | Caveney ...................... 174/72 A X |
| 3,588,081 | 6/1971 | Logan et al. ................. 174/72 A X |
| 3,872,567 | 3/1975 | Cea et al. ........................... 29/721 |
| 3,930,524 | 1/1976 | Tarbox ........................... 29/755 X |

Primary Examiner—Howard N. Goldberg
Assistant Examiner—Carl J. Arbes
Attorney, Agent, or Firm—Robert T. Mayer

[57] ABSTRACT

The invention relates to a method of arranging flexible, insulated conductors of a bundle of unaligned electrical conductors into an aligned mutual position before soldering the stripped ends of the conductors (27) to conduction paths of a contact member, for example of a printed circuit board. The unaligned conductors (25) are drawn from an unaligned position between the flush teeth (13, 14) of two combs (9, 11) until the transitions of the insulated parts of the conductors (26) to the stripped parts (27) have just passed the first comb (11), whereupon the conductors are clamped in narrow spaces (15, 16) between the teeth (13, 14). The two combs (9, 11) are arranged on a base plate (3). The teeth are thin at the top (17, 19) and become broader at the base (21, 23).

7 Claims, 3 Drawing Figures

METHOD AND DEVICE FOR ALIGNING AND STRAIGHTENING FLEXIBLE, INSULATED CONDUCTORS

The invention relates to a method of arranging flexible, insulated conductors of an unaligned bundle of electrical conductors into an aligned mutual position before soldering the stripped ends of the conductors to conduction paths of a contact member, and to a device for implementing this method and to forming a safeguard against buckling of conductors fixed by this method and then soldered to the contact member.

In electrical circuit technology circuit boards are frequently connected to each other by means of flexible conductors. To simplify such connections and to improve their accessibility it is common practice to bundle together several conductors in the form of a stripcable, the insulations of the adjacent conductors then being interconnected via insulation bridges. Stripcables of this type possess a certain stiffness which hinders their application even when strongly bent. Especially in car radios, where an exceptionally compact mode of construction is important, stripcables are very difficult to use. If individual conductors are employed, particular attention has to be paid to the connections since the individual conductors reach the soldering positions without any particular alignment.

It may be assumed that it is possible to simplify assembly by giving the bundle of conductors at a given position an alignment that corresponds for example to the alignment of a stripcable. From that position the individual conductors can then be pulled into the required soldering position. The assembly procedure is however labor intensive.

The object of the invention is to provide a method of the kind mentioned in the preamble whereby the individual conductors can quickly and without complications be brought into alignment with the soldering positions, and to provide a device for implementing the method.

The object of the invention is attained in that from an aligned position the unaligned conductors are drawn between the flush teeth of non-metallic combs arranged one behind the other until the transitions from the insulated to the stripped ends of the conductors have just passed the first comb, whereupon the conductors are clamped in position in narrow spaces between the teeth. The individual conductors are thus drawn through the combs like hairs from a place of alignment, so that the stripped ends finally come into exact mutual alignment with the exactly specified positions on the contact member, for example a printed circuit board, where they are to be soldered. This procedure is simple and secure.

The method is implemented by means of a device which is characterised by at least two flush non-metallic combs arranged one behind the other and interconnected via a base plate, the flush teeth becoming broader towards the base plate so as to form narrow spaces at the base of the teeth. In the upper parts the teeth are far enough apart for the conductors to be easily drawn between them. Once the conductors have been pulled through, they are pressed into the narrow spaces where they are firmly clamped.

To achieve the required clamping, provision is made in a further embodiment of the device for the narrow spaces of the second comb in which the conductors with their insulated parts are clamped to correspond in width to precisely the diameter of the insulation.

The narrow spaces of the first comb, in which the stripped ends of the conductors come to lie, are designed to have a width such that they keep the ends at exactly the distance that corresponds to the appropriate soldering slots on the bonding pad.

In the final assembled state, when the conductors have been soldered to the printed circuit board, the device serves as a guard against buckling of the conductors immediately above the printed board. In the case of through-contacted bonding pads these positions are particularly vulnerable to breakage by buckling, since the solder rises through the holes in the bonding pad, where it bonds together the individual strands and, after solidification, deprives them of their flexibility. In the assembled state, the bending load is shifted by the device into the area of the second comb and hence to a position that cannot be reached by the liquid solder.

A further embodiment of the invention provides for the spacing between the combs to correspond to the spacing of the conductors in stripcables. The device can thus similarly be used for safeguarding against buckling in the case of stripcables.

In a further embodiment of the invention the outer surface of the first comb, which serves as a support for the contact member, is provided with cams which, when the device is fitted on to the contact member, serve as stops. By means of these cams the device can be fitted exactly and securely on to a printed circuit board, so that the conductors are held fast until they are soldered to the printed circuit board with the aid of the device.

Figure 2:
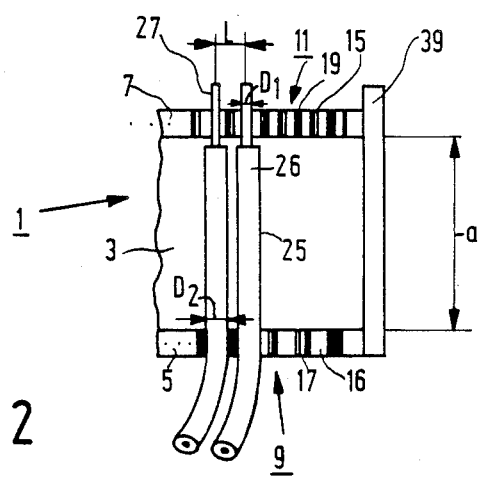

A more detailed explanation of the invention will be given with reference to the drawings, in which:

FIG. 1 shows schematically a part of the device for implementing the method in accordance with the invention, FIG. 2 gives a plan view of the device to illustrate the clamping of the conductors, and FIGS. 3a–3e illustrates the assembly procedure up to soldering.

FIG. 1 shows schematically a device by means of which unaligned individual electrical conductors from a place of alignment, for example a plug, can be brought into mutual alignment in order to be further worked or processed at a required position. This device 1 consists of a plastic base plate 3 on whose longitudinal sides 5, 7 plastic combs 9, 11 with teeth 13, 14 are arranged. The teeth 13, 14 are arranged in two rows perpendicular to the base plate 3. The teeth 13, 14 consist of members that are narrow at the top 17, 19 and which, via arched transitions, widen out towards the base 21, 23. The distance between the teeth at the top 17 and 19 is so arranged that electrical leads 25 can be drawn between them with some lateral play.

Near their base 23 the teeth 13 of the front comb 11 are spaced in such a way that the distance between them is a little larger than the diameter $D_1$ of the stripped parts 27 of the electrical conductors 25. At their base 21 the teeth 14 are spaced at a distance apart which is smaller than the diameter $D_2$ of the stripped parts 26 of the electrical conductors 25. By virtue of these relationships between the diameter $D_1$ and $D_2$ and those of the conductors 25 and of the teeth of the combs 9 and 11, it is possible by pressing the conductors 25 into the narrow spaces 15, 16 to clamp them between the teeth 14 and to position the stripped ends 27 of the conductors 25 between the teeth 13.

In FIG. 2 the distance between two wires 25 to be positioned is indicated by L. This distance does not necessarily have to be adhered to. It can correspond to the distance between two conductors 25 of a stripcable. In this way a stripcable too can be clamped in the device 1, enabling the device to be used as a safeguard against buckling.

FIG. 1 gives a greatly magnified representation of the device and also of the mutual spacings of the teeth and their width. In FIG. 2 the conductors are shown close together more in accordance with the actual data.

When several individual conductors 25 from a position of alignment not shown here, for example a plug, end in an unaligned state, then in the neighbourhood of this position of alignment the device 1 is placed on to the conductors 25 in such a way that they lie in alignment in the combs 9, 11 relative to the alignment position. The conductors 25 are then drawn through the combs until the junction of the stripped ends 27 and the unstripped portions with insulation remaining on them have passed the teeth of the first comb 11. Once this has happened, the conductors 25 are pressed into the narrow spaces 15, 16 between the teeth 13, 14. In this way the unaligned conductors 25 of a bundle of conductors are aligned and straightened so that without difficulties they can be laterally moved into line with the appropriate connector slots of a printed circuit board.

Figure 3A:
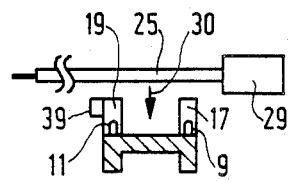
Figure 3B:
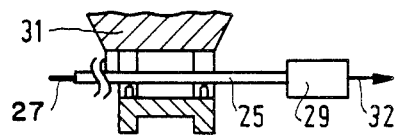
Figure 3C:
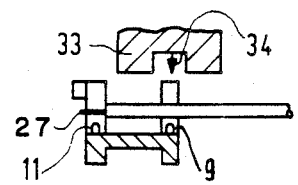
Figure 3D:
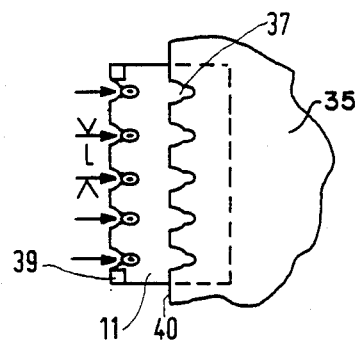
Figure 3E:
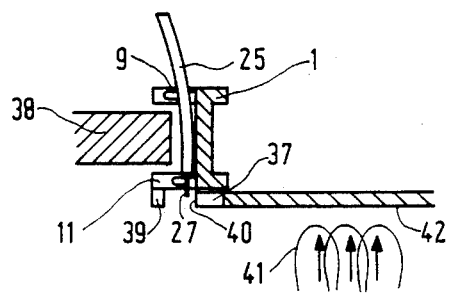

The drawings in FIGS. 3a to 3e show the individual steps in the alignment of the conductors 25 up to the mounting of the device together with the conductors on a bonding pad. Arranged on a plug 29 is a row of conductors, of which only the front conductor 25 is shown. The conductors 25 are then laid in the direction of arrow 30 between the narrow parts 17, 19 of the teeth 14, 13. This situation is shown in FIG. 3b. After a cover 31 has been mounted, the plug 29 is now drawn into the direction of arrow 32, during which process the individual conductors 25 are aligned. The drawing process terminates when the stripped ends 27 of the conductors 25 arrive in comb 11. This situation can be seen in FIG. 3c. A clamping tool 33 is now pressed in the direction of an arrow 34 on to the conductors 25, thereby pressing the insulated conductors into the narrow spaces 16 of the rear comb 9. This is shown in FIG. 3e.

By means of the device 1 the conductors 25 are to be soldered to the connectors or conduction paths of an electrical contact member serving as a bonding pad 35. The bonding pad is provided with slots 37, the distance between each slot corresponding to the distance L between the stripped ends 27 of the conductors 25 (FIG. 3d). A tool 38 is used to slide the device 1 with the conductors 25 on to the bonding pad 35 until the cams 39 of the device 1 come up against the leading edge 40 of the bonding pad 35. The stripped ends 27 of the conductors 25 then lie in the slots 37. By means of a suitable soldering process, indicated by 41, the ends 27 are soldered to the connectors or conduction paths 42 of the printed circuit board.

As can be seen from FIGS. 1 and 2, the two combs 9, 11 are separated by a distance a. This distance is chosen so that there is so much space between the first and the second comb 9, 11 that in the parts 26 of the conductors that remain insulated rising liquid solder cannot reach the area of the second comb 9. In the assembled or soldered state, provisions are made to ensure that any later bending load on the conductors 25 is shifted so that the conductors remain flexible at the position where the bending load occurs. In this way rupture of the wires is prevented.

What is claimed is:

1. A method of arranging flexible, insulated conductors of a bundle of unaligned conductors having stripped ends into an aligned condition prior to soldering said stripped ends to associated connectors, said method including drawing said conductors through the spaces between parallel teeth of each of two non-metallic combs, said combs being disposed one behind the other as a front comb and a rear comb with a space between them, said teeth of said rear comb being broader at their bases than at their tips so as to narrow the spaces between them, said conductors being so drawn until the junction between the stripped end of each and its insulation portion is located just within the space between said combs in said aligned condition with said stripped ends lying between associated teeth of said front comb and clamping said conductors in such position by pressing their insulation portions down into the narrow spaces between the broadened portions of the teeth of said rear comb.

2. A combination of a plurality of flexible insulated conductors and a device for arranging them in aligned condition, said conductors having stripped ends, said device comprising two non-metallic combs each with parallel teeth, said combs being disposed one comb behind the other as a front comb and a rear comb with a space between said two combs, and a base plate interconnecting said combs, said teeth of said rear comb being broader at their bases than at their tips whereby the spaces between them are narrower at their bases than at their tips, each said conductor being disposed with the junction between its stripped end and its insulation portion located in the space between said combs with its stripped end located between two of the teeth of said front comb and its insulation portion pressed into one of the narrower spaces between two of the teeth of said rear comb.

3. A combination according to claim 2 wherein said teeth of said front comb are broader at their bases than at their tips with the spaces between them narrower at their bases than at their tips.

4. A combination according to claim 3 wherein the narrower spaces of said front comb, in which said stripped ends lie, correspond in width to the diameter of said stripped ends and wherein the narrower spaces of said rear comb in which said insulation portions lie precisely correspond in width to the diameter of the insulated conductors so as to clamp the insulation portions of the conductors.

5. A combination according to claim 4 wherein the mean mutual distance between the narrower spaces of said rear comb corresponds to the mutual distance between conductors in a stripcable.

6. A combination according to claim 3 wherein the outer surface of the front comb is provided with cams which serve as stops for fitting the device onto an electrical member having connectors to which the stripped ends of said conductors are to be soldered.

7. A combination according to claim 4 wherein the outer surface of the front comb is provided with cams which serve as stops for fitting the device onto an electrical member having connectors to which the stripped ends of said conductors are to be soldered.

* * * * *